(12) United States Patent
Jung et al.

(10) Patent No.: US 10,411,115 B2
(45) Date of Patent: Sep. 10, 2019

(54) SEMICONDUCTOR DEVICE INCLUDING A RECESSED INSULATION REGION AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Dae-Sub Jung, Shanghai (CN); Lei Fang, Shanghai (CN); Guang Li Yang, Shanghai (CN); De Yan Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/613,813

(22) Filed: Jun. 5, 2017

(65) Prior Publication Data

US 2017/0271482 A1    Sep. 21, 2017

(30) Foreign Application Priority Data

Jun. 12, 2016    (CN) .......................... 2016 1 0407516

(51) Int. Cl.
*H01L 29/66*    (2006.01)
*H01L 21/027*    (2006.01)
(Continued)

(52) U.S. Cl.
CPC .... *H01L 29/66681* (2013.01); *H01L 21/0274* (2013.01); *H01L 21/266* (2013.01);
(Continued)

(58) Field of Classification Search
CPC .......... H01L 29/66681; H01L 21/3085; H01L 29/66659; H01L 29/0649; H01L 29/42368;
(Continued)

(56) References Cited

U.S. PATENT DOCUMENTS

2009/0273029 A1    11/2009    Tien et al.
2010/0148254 A1*   6/2010    Park ................ H01L 21/823462
                                                                257/337
(Continued)

FOREIGN PATENT DOCUMENTS

CN    103137692 A    6/2013
JP    2005183633 A    7/2005
JP    2009124037 A    6/2009

OTHER PUBLICATIONS

The European Patent Office (EPO) The Extended European Search Report for 17174785.0 dated Oct. 20, 2017 11 Pages.

*Primary Examiner* — John P. Dulka
(74) *Attorney, Agent, or Firm* — Anova Law Group, PLLC

(57) ABSTRACT

The present disclosure provides a method for forming a semiconductor device, including: forming a mask layer over a substrate, the mask layer containing an opening, exposing a surface portion of the substrate to form an exposed surface portion of the substrate; forming an insulation structure between the mask layer and the substrate, and in the opening; performing a thinning process on the insulation structure exposed by the opening to form a recess region on a top of the insulation structure; and forming a gate electrode over the insulation structure and covering a portion of the recess region.

20 Claims, 5 Drawing Sheets

(51) Int. Cl.
    *H01L 21/266*     (2006.01)
    *H01L 21/3065*     (2006.01)
    *H01L 21/308*     (2006.01)
    *H01L 21/762*     (2006.01)
    *H01L 29/06*     (2006.01)
    *H01L 29/78*     (2006.01)
    *H01L 29/423*     (2006.01)
    *H01L 29/10*     (2006.01)

(52) U.S. Cl.
    CPC ...... *H01L 21/3065* (2013.01); *H01L 21/3085* (2013.01); *H01L 21/7624* (2013.01); *H01L 29/0649* (2013.01); *H01L 29/42368* (2013.01); *H01L 29/66659* (2013.01); *H01L 29/7824* (2013.01); *H01L 29/7835* (2013.01); *H01L 29/1045* (2013.01); *H01L 29/42376* (2013.01)

(58) Field of Classification Search
    CPC ............. H01L 21/3065; H01L 29/7835; H01L 21/7624; H01L 21/0274; H01L 29/7824; H01L 21/266; H01L 29/42376; H01L 29/1045
    See application file for complete search history.

(56) References Cited

U.S. PATENT DOCUMENTS

2015/0021735 A1*   1/2015   Wen ................ H01L 21/76205
    257/510
2015/0137232 A1*   5/2015   Huang ............... H01L 29/7816
    257/343

\* cited by examiner

SEMICONDUCTOR DEVICE INCLUDING A RECESSED INSULATION REGION AND FABRICATION METHOD THEREOF

CROSS-REFERENCES TO RELATED APPLICATIONS

This application claims the priority of Chinese Patent Application No. 201610407516.7 filed on Jun. 12, 2016, the entire content of which is incorporated herein by reference.

FIELD OF THE DISCLOSURE

The present disclosure generally relates to the field of semiconductor technology, more particularly, relates to a semiconductor device and a method for forming the semiconductor device.

BACKGROUND

Laterally diffused metal oxide semiconductor (LDMOS) transistors are mainly used in power integrated circuits. An LDMOS transistor is a semiconductor device that forms a lateral current path on the surface of a semiconductor substrate by planar diffusion. Thus, an LDMOS transistor often has many advantages such as thermal stability and frequency stability, relatively high gain, durability, relatively low feedback capacitance and thermal resistance, constant input impedance, and simple biasing current circuit.

For an LDMOS transistor used in a power integrated circuit, the on-resistance ($R_{dson}$) and breakdown voltage (BV) of the LDMOS transistor are two important indicators of the device performance. An LDMOS transistor is often desired to have a relatively high BV and a relatively low $R_{dson}$. However, the on-resistance ($R_{dson}$) and breakdown voltage (BV) of conventional LDMOS transistors cannot be simultaneously improved.

The disclosed semiconductor device and the method for forming the semiconductor device are directed to solve one or more problems set forth above and other problems.

BRIEF SUMMARY OF THE DISCLOSURE

One aspect of the present disclosure provides a method for forming a semiconductor device, including: forming a mask layer over a substrate, the mask layer containing an opening, exposing a surface portion of the substrate to form an exposed surface portion of the substrate; forming an insulation structure between the mask layer and the substrate, and in the opening; performing a thinning process on the insulation structure exposed by the opening to form a recess region on a top of the insulation structure; and forming a gate electrode over the insulation structure and covering a portion of the recess region.

Another aspect of the present disclosure provides a semiconductor device, comprising: a substrate; an insulation structure on the substrate, a top of the insulation structure having a recess region; and a gate electrode, over the insulation structure and covering a portion of the recess region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiment, persons of ordinary skill in the art may derive other embodiments consistent with the present disclosure, all of which are within the scope of the present invention.

Figure 1:
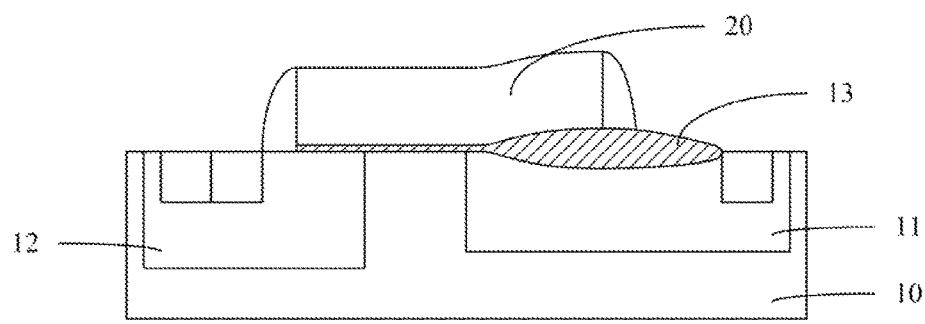
FIG. 1 illustrates a cross-sectional view of an LDMOS transistor.

FIG. 1 illustrates a cross-sectional view of an LDMOS transistor.

As shown in FIG. 1, the LDMOS transistor includes a substrate 10, a body region 12, a drift region 11, an insulation structure 13, and a gate electrode 20. The body region 12 and the drift region 11 are located in the substrate 10 and are separated from each other. The insulation structure 13 is located in the drift region 11. The gate electrode 20 is over the substrate 10. One end of the gate electrode 20 extends to be over a portion of the body region 12, and the other end of the gate electrode 20 extends to be over the insulation structure 13.

Often, increasing the lateral dimension of the insulation structure 13 in the direction parallel to the substrate surface can increase the BV of the LDMOS transistor. However, during the formation of the LDMOS transistor, the insulation structure 13 is often formed through local oxidation of silicon. Using the local oxidation of silicon, when the lateral dimension of the insulation structure 13 is increased, the thickness of the insulation structure 13 can also be increased at the same time.

Because one end of the gate electrode 20 extends to be over the insulation structure 13, an increase in the thickness of the insulation structure 13 can result in a reduced control ability of the gate electrode 20, which further causes the depletion region in the drift region 11 to have a reduced thickness. The decrease in the thickness of the depletion region can cause the BV of the LDMOS transistor to decrease, and the performance of the LDMOS can be affected accordingly.

Various embodiments provide a process for forming a semiconductor device. In the process, a substrate is provided, and a mask layer is formed over the substrate. The mask layer includes an opening and the bottom of the opening exposes a portion of the surface of the substrate. An insulation structure is formed in the substrate at the bottom of the opening. A thinning process is performed on the insulation structure exposed by the opening to thereby forming a recess region on the top of the resultant insulation structure. A gate electrode is formed over the substrate, and the gate electrode covers a portion of the recess region.

In the present disclosure, by forming a recess region on the top of the insulation structure to reduce the thickness of the insulation structure, the distance between the gate electrode, over the insulation structure, and the substrate, can be decreased. This allows an easy increase of the thickness of the depletion region under the insulation structure and the control ability of the gate electrode. Thus, current density can be improved, the thickness of the depletion region under the insulation structure can be increased, and the BV of the semiconductor device can be improved.

In the present disclosure, the semiconductor device is used to form an LDMOS transistor. In other various embodiments, the disclosed technical solution can be used to form any other suitable semiconductor devices.

To better illustrate the abovementioned goal, features, and advantages of the present disclosure, embodiments of the present disclosure are now illustrated in detail in connection with the drawings.

Figure 10:
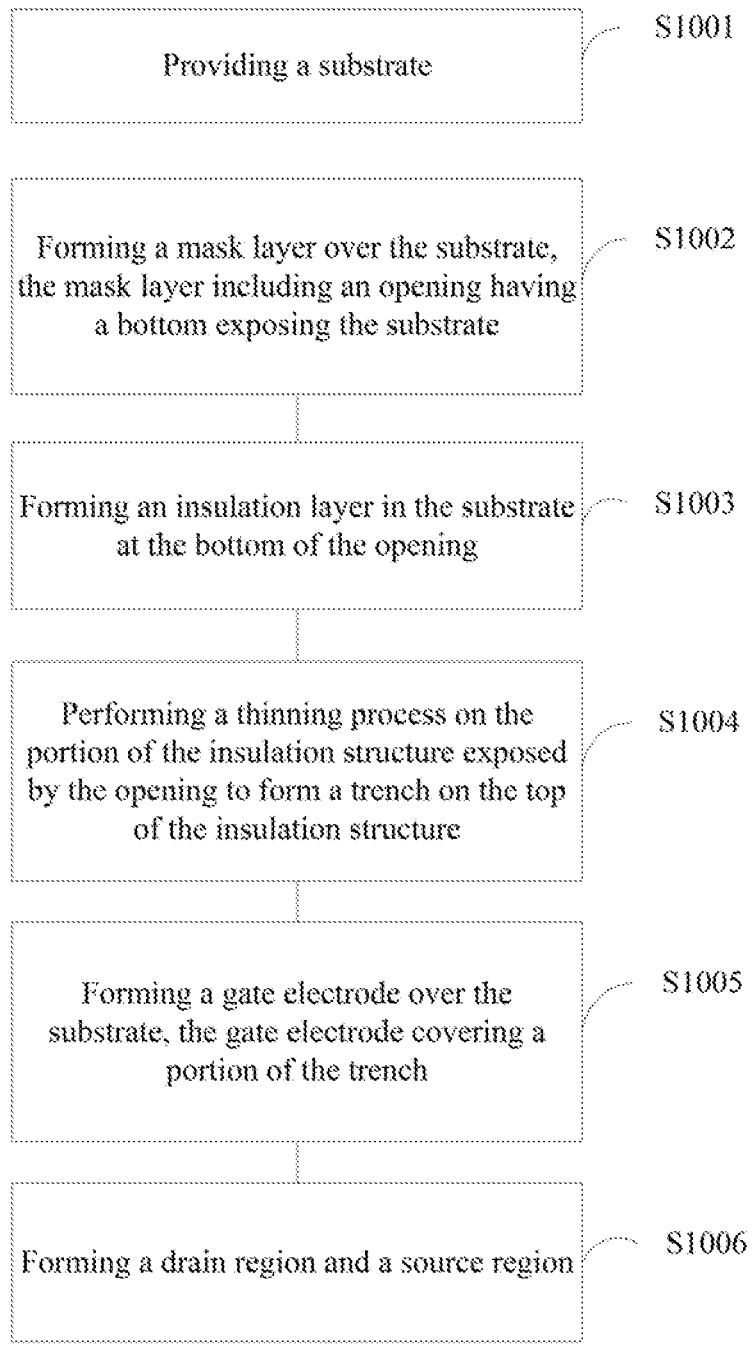
FIG. 10 illustrates a flow chart of an exemplary process to fabricate an exemplary LDMOS transistor consistent with various disclosed embodiments of the present disclosure.

FIG. 10 illustrates an exemplary flow chart to fabricate an LDMOS transistor and FIGS. 2-7 illustrate the cross-sectional views of an exemplary semiconductor device corresponding to various stages of an exemplary fabrication process.

Figure 2:
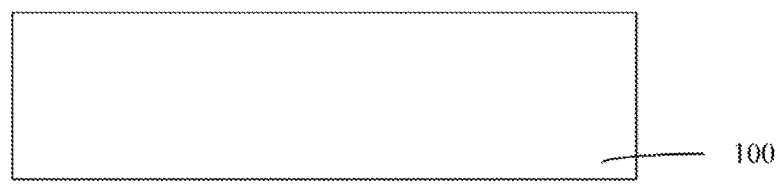
FIGS. 2-7 each illustrates a cross-sectional view of an LDMOS transistor at a certain stage during an exemplary process to fabricate the LDMOS transistor consistent with various disclosed embodiments of the present disclosure.

As shown in FIG. 10, at the beginning of the fabrication process, a substrate is provided (S1001). FIG. 2 illustrates a corresponding structure.

As shown in FIG. 2, a substrate 100 may be provided. The substrate 100 may provide a platform for fabrication. In one embodiment, the substrate 100 may be made of single crystal silicon. In other embodiments of the present disclosure, the substrate 100 may be made of poly-silicon and/or amorphous-silicon. The substrate 100 may also be made of one or more of silicon, germanium, gallium arsenide, and/or silicon germanium compounds. The substrate 100 may also be made of other suitable semiconductor materials. The substrate 100 may also be made of a silicon structure having an epitaxial layer and/or an epitaxial layer on silicon structure.

Figure 3:
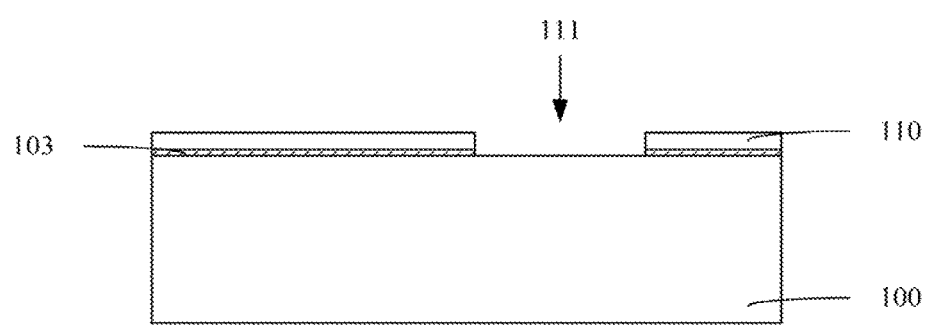

As shown in FIG. 10, after a substrate is provided, a mask layer is formed over the substrate, the mask layer including an opening having a bottom exposing the substrate (S1002). FIG. 3 illustrates a corresponding structure.

As shown in FIG. 3, a mask layer 110 may be formed over the substrate 100. The mask layer 110 may include an opening 111, and the bottom of the opening 111 may expose the substrate 100.

The mask layer 110 may define the location and the dimensions of the insulation structure, to be formed subsequently. The mask layer 110 may also protect other portions of the substrate 100 from being oxidized when the insulation structure is subsequently formed using an oxidation process. The material for forming the mask layer 110 may include silicon nitride. The mask layer 110 may be formed through one or more of deposition methods such as chemical vapor deposition, physical vapor deposition, and atomic layer deposition.

To reduce the strain between the mask layer 110 and the substrate 100 and to alleviate lattice mismatch, in one embodiment, after forming the substrate 100 and before forming the mask layer 110, the process to form the semiconductor device may further include forming an oxidation layer 103 over the substrate 100.

The mask layer 110 may be a patterned mask layer. The mask layer 110 may include an opening 111. The bottom of the opening 111 may expose the substrate 100. The portion of the substrate 100 exposed by the opening 111 may be subsequently oxidized to form an insulation structure.

Specifically, to form the mask layer 110, a mask material layer may be formed over the substrate 100. A patterning layer may be formed over the mask material layer, to define the dimensions and location of the opening 111. The patterning layer may be used as a mask to etch the mask material layer, to remove a portion of the mask material layer to expose the substrate 100. Thus, the mask layer 110 and the opening 111 in the mask layer 110 may be formed.

In one embodiment, the patterning layer may be a patterned photoresist layer, formed through a photoresist coating and a photolithography process. The patterning layer may also be formed through a multiple patterning mask process. The multiple patterning mask process may include one or more of a self-aligned double patterning (SaDP) process, a self-aligned triple patterning process, and self-aligned double patterning (SaDDP) process.

Figure 4:
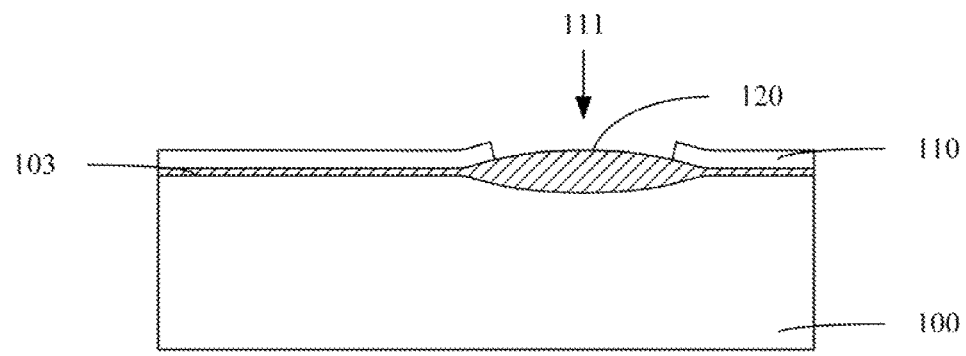

As shown in FIG. 10, after a mask layer is formed over the substrate, an insulation layer is formed in the substrate at the bottom of the opening (S1003). FIG. 4 illustrates a corresponding structure.

As shown in FIG. 4, an insulation structure 120 may be formed in the substrate 100 at the bottom of the opening 111.

The insulation structure 120 may separate the channel region of the LDMOS transistor and the drain region of the LDMOS region, to facilitate the extension of current path and increase the BV of the LDMOS transistor. The insulation structure 120 may be made of a suitable oxide.

The insulation structure 120 may be formed through a local oxidation of silicon (LOCOS) process and may be formed over the portion of substrate 100 at the bottom of the opening 111.

An oxidation layer 103 may be formed between the mask layer 110 and the substrate 100. When using LOCOS to form the insulation structure 120, some oxygen atoms may diffuse into the substrate 100 along a direction perpendicular to the substrate 100, and some oxygen atoms may diffuse laterally along the oxidation layer 103 in a plane parallel to the surface of the substrate 100. Thus, the insulation structure 120 may be formed at the bottom of the opening 111 and under the portions of the mask layer 110 neighboring the opening 111. Further, along the direction from a sidewall of the opening 111 to a neighboring portion of the mask layer 110, the thickness of the insulation structure 120 may gradually decrease. That is, the insulation structure 120 may have a bird's beak structure under the mask layer 110. The neighboring portion of the mask layer 110 represents a portion of the mask layer 110 located further away from the opening 111 than the sidewall of the opening 111.

The insulation structure 120 may separate the channel region of the LDMOS transistor and the drain region of the LDMOS transistor, and may extend the current path. If, in the plane parallel to the surface of the substrate, the dimensions of the insulation structure, are too small, the distance between the channel region of the LDMOS and the drain region, each subsequently formed, may be too small, making it difficult to increase the BV of the LDMOS transistor. Thus, in the plane parallel to the surface of the substrate 100, the dimensions of the insulation structure may not be too small. During the formation of the insulation structure, it is desired to facilitate lateral diffusion of oxygen atoms in the plane parallel to the surface of the substrate 100, to increase the lateral dimension of the insulation structure.

During the formation of the insulation structure 120, at the same time the oxygen atoms are diffusing laterally, the oxygen atoms are also diffusing along the direction perpendicular to the surface of the substrate 100. Thus, when the dimensions of the insulation structure 120 in the plane parallel to the surface of the substrate 100 satisfy the design requirement, the thickness of the insulation structure 120 may be considerably large.

Figure 5:
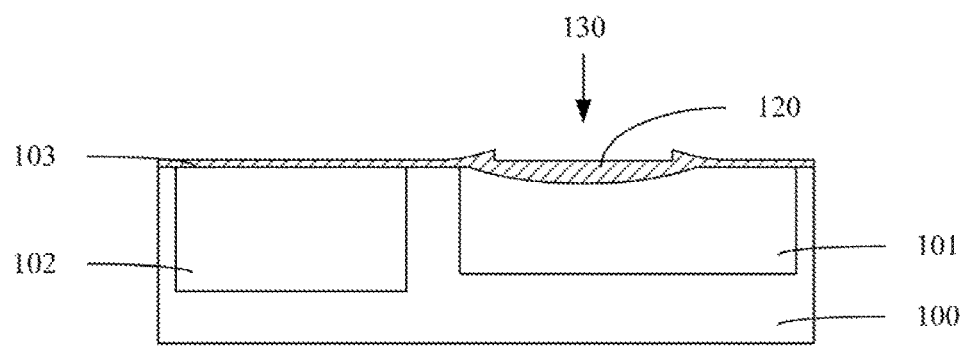

As shown in FIG. 10, after an insulation layer is formed in the substrate at the bottom of the opening, a thinning process may be performed on the portion of the insulation structure exposed by the opening to form a recess region on the top of the insulation structure (S1004). FIG. 5 illustrates a corresponding structure.

As shown in FIG. 5, a thinning process may be performed on the portion of the insulation structure 120 exposed by the opening 111 to form a recess region 130 on the top of the insulation structure 120.

The recess region 130 may reduce the thickness of the insulation structure 120. The step to perform the thinning process on the portion of the insulation structure 120 exposed by the opening 111 to form the recess region 130 on the top of the insulation structure 120 may include the follows. The mask layer 110 may be used as the mask to etch a portion of the total thickness of the insulation structure 120 at the bottom of the opening 111. The recess region 130 may be formed on the top of the insulation structure 120.

By removing a portion of the material on the top of the insulation structure 120 and forming the recess region 130 on the top of the insulation structure 120, the thickness of the insulation structure 120 may be reduced. Accordingly, the distance between the gate electrode, subsequently formed over the insulation structure 120, and the substrate 100, may be reduced, and the gate electrode may have improved control ability. The increase in the control power of the gate electrode may increase the current which will decrease the on resistance, and increase the thickness/depth/width of the depletion layer under the insulation structure which will increase the BV of LDMOS.

The recess region 130 may be formed through a dry etching process. Specifically, the mask layer 110 may be used as the mask, to remove a portion of the total thickness of the top of the insulation structure 120 using the dry etching process. The recess region 130 may be formed on the top of the insulation structure 120.

If the thickness of the removed portion of the insulation structure 120 is too large, the recess region 130 may be too deep, and the thickness of the remaining portion of the insulation structure 120 may be too small, making it susceptible to gate electrode breakdown. In one embodiment, in the step of forming the recess region 130, the thickness of the removed portion of the insulation structure 120 may be less than half of the total thickness of the insulation structure 120. That is, a ratio of the depth of the recess region 130 to the thickness of the remaining portion of the insulation structure 120 may be less than 1. For example, in some embodiments, the thickness of the remaining portion of the insulation structure 120 may range between about 220 Å to about 280 Å. In some other embodiments, the thickness of the remaining portion of the insulation structure 120 may range between about 450 Å to about 550 Å.

In one embodiment, the disclosed semiconductor device may be used for forming an LDMOS transistor. Thus, after the recess region 130 is formed, the process to form the semiconductor device may further include forming a first doped region 101 and a second doped region 102 in the substrate 100. The first doped region 101 may surround the insulation structure 120. The second doped region 102 may be separated from the first doped region 101 by a certain distance.

Specifically, in one embodiment, after forming the recess region 130, the mask layer 110 may be removed to facilitate the subsequent processing of the semiconductor device.

Further, the first doped region 101 may be formed under and neighboring the insulation structure 120, in the substrate 100. The first doped region 101 may be the drift region of the LDMOS transistor, for extending the current path of the LDMOS transistor formed from the disclosed semiconductor device. BV may be improved accordingly.

The first doped region 101 may be doped with first dopant ions. The first dopant ions may include N type ions or P type ions. The specific type of dopant ions may be determined based on the type of the LDMOS transistor to be formed. In one embodiment, the LDMOS transistor to be formed may be an N type transistor, and the first dopant ions may be N type, including one or more of phosphorous ions, arsenic ions, and antimony ions.

The first doped region 101 may be formed through an ion implantation process in the substrate 100. Specifically, in the step to form the first doped region 101, the ion implantation process may be performed in the portions of the substrate 100 under and neighboring the insulation structure 120, to form the first doped region 101 that surrounds the insulation structure 120.

Because the recess region 130 is formed on the top of the insulation structure 120, the thickness of the remaining portion of the insulation structure 120 is desirably small, when ions are implanted into the first doped region 101, more ions may be doped into the substrate 100. Thus, using the same implantation condition, in the present disclosure, the doping concentration of the first doped region 101 can be desirably high, making it easier to reduce the on-resistance of the LDMOS transistor formed from the disclosed semiconductor device.

After forming the first doped region 101, the second doped region, separated from the first doped region 101, may be formed in the substrate 100. The second doped region may be doped with second dopant ions.

The second doped region 102 may be the body region of the LDMOS transistor formed from the disclosed semiconductor device, to form a channel region having doping concentration that varies in gradient. The conductivity type of the second dopant ions may be opposite of the conductivity type of the first dopant ions. Specifically, in one embodiment, the second dopant ions may be P type ions, including one or more of boron ions, indium ions, and gallium ions.

Specifically, the second doped region 102 may also be formed through ion implantation in the substrate 100.

In one embodiment, forming the second doped region 102 after the formation of the first doped region 101 is only exemplary. In other various embodiments, the second doped region 102 may also be formed before the formation of the first doped region.

Figure 6:
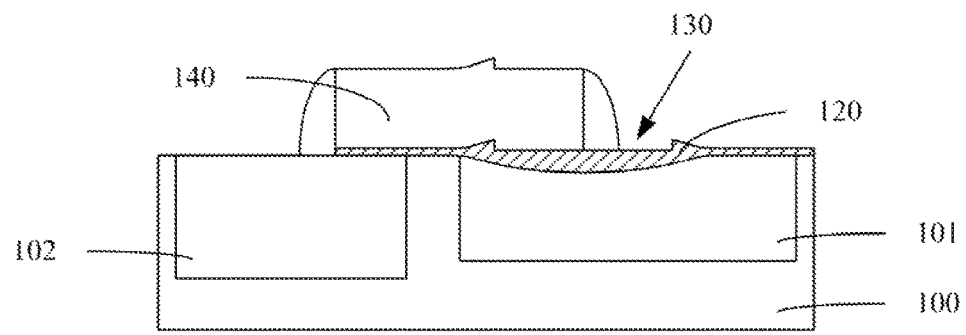

As shown in FIG. 10, after thinning the portion of the insulation structure exposed by the opening to form a recess region on the top of the insulation structure, a gate electrode is formed over the substrate, the gate electrode covering a portion of the recess region (S1005). FIG. 6 illustrates a corresponding structure.

As shown in FIG. 6, a gate electrode 140 may be formed over the substrate 100, the gate electrode 140 covering a portion of the recess region 130.

The gate electrode 140 may cover a portion of the recess region 130. Compared to a technical solution without having a recess region, the thickness of the insulation structure 120 at the bottom of the recess region, as in the present disclosure, may be desirably small. Thus, the distance between the gate electrode 140 and the first doped region 101 may be desirably small, and the gate electrode 140 may have improved control ability. When the LDMOS transistor, formed from the disclosed semiconductor device, is turned on, the gate electrode 140 may effectively increase the thickness of the depletion region in the first doped region 101, and the on-resistance of the LDMOS transistor may be reduced. The BV of the LDMOS transistor may be increased.

In one embodiment, the disclosed semiconductor device can be used to form an LDMOS transistor. The substrate 100 may include the second doped region 102 used to form a body region. Thus, during the step to form the gate electrode 140, the gate electrode 140 may also be over the second doped region 102, to control the second doped region 102.

Figure 7:
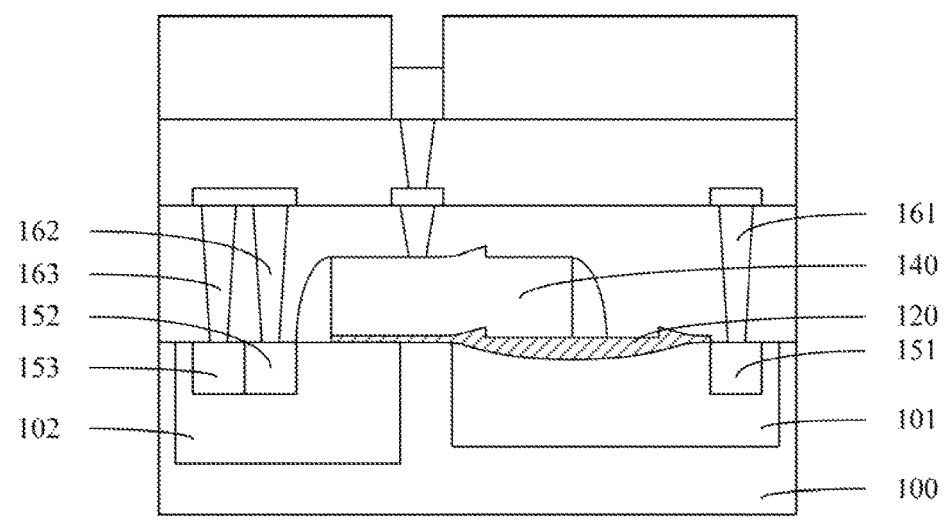

As shown in FIG. 10, after forming a gate electrode over the substrate, a drain region and a source region are formed (S1006). FIG. 7 illustrates a corresponding structure.

As shown in FIG. 7, a drain region 151 and a source region 152 may be formed. The drain region 151 may be formed in the first doped region 101 on the side of the insulation structure 120 facing away from the gate electrode 140. The drain region 151 may be doped with first dopant ions. The source region 152 may be formed in the portion of the second doped region 102 exposed by the gate electrode 140. The source region 152 may be doped with first dopant ions.

Specifically, the drain region 151 and the source region 152 may be formed through a suitable ion doping process. The specific process to form the drain region 151 and the source region 152 is not described herein.

In addition, the process to form the disclosed semiconductor device may further include forming a lightly-doped region 153, a source-connecting plugging structure 162, a drain-connecting plugging structure 161, and a lightly-doped-connecting plugging structure 163. The lightly-doped region 153 may be formed in the second doped region 102 on the side of the source region 152 facing away from the gate electrode 140. The lightly-doped region 153 may be doped with second dopant ions. Further, the source-connecting plugging structure 162 may be formed on the source region 152, the drain-connecting plugging structure 161 may be formed on the drain region 151, and the lightly-doped-connecting plugging structure 163 may be formed on the lightly-doped region 153.

Figure 8:
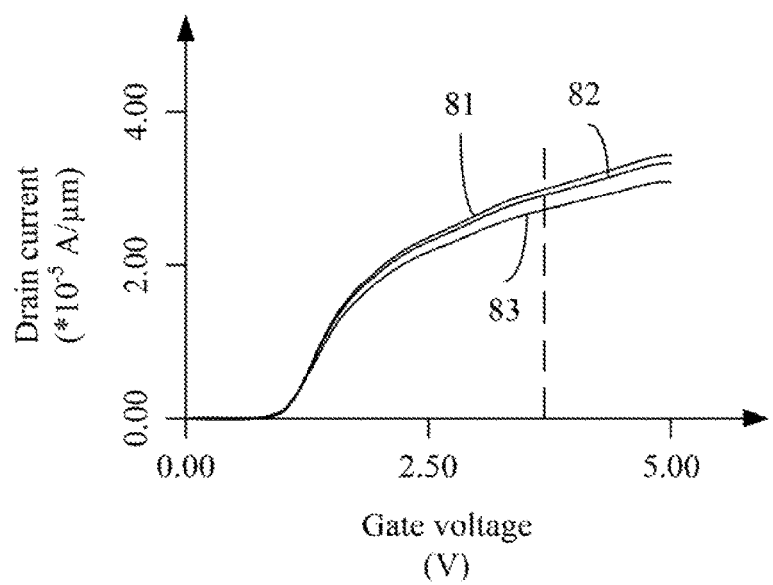
FIGS. 8-9 each illustrates a comparison of certain volt-ampere characteristic curves between a disclosed LDMOS transistor and a conventional LDMOS transistor.

FIG. 8 illustrates a comparison of volt-ampere characteristic curves between the disclosed LDMOS transistor and a conventional LDMOS transistor.

In FIG. 8, the x axis represents the gate voltage of an LDMOS transistor, in the unit of volt (V), and the y axis represents the source-drain on-current density of the LDMOS transistor in the unit of 10-5 A/m. Curve 81 shows the volt-ampere characteristic of an LDMOS transistor, of which 500 Å of the insulation structure 120 has been removed. Curve 82 shows the volt-ampere characteristic of an LDMOS transistor, of which 250 Å of the insulation structure 120 has been removed. Curve 83 shows the volt-ampere characteristic of a conventional LDMOS transistor.

As shown in FIG. 8, at a same gate voltage, the source-drain on-current of a disclosed LDMOS transistor is higher than the source-drain on-current of a conventional LDMOS transistor. Further, for the three transistors shown in FIG. 8, the linear drain current of the LDMOS, having 500 Å of the insulation structure 120 removed, is about 34.5 µA/µm; the linear drain current of the LDMOS, having 250 Å of the insulation structure 120 removed, is about 33.3 µA/µm; and the linear drain current of the conventional LDMOS, is about 31.1 µA/µm. Thus, the disclosed technical solution may effectively reduce the on-resistance of the formed LDMOS transistor.

Figure 9:
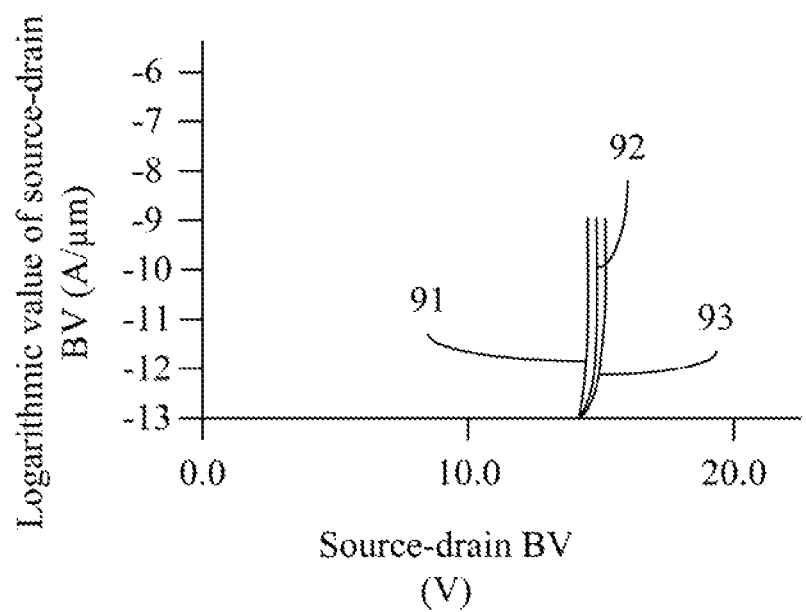

FIG. 9 illustrates a comparison of breakdown characteristic between a disclosed LDMOS transistor and a conventional LDMOS transistor.

In FIG. 9, the x axis represents the source-drain BV applied on the drain region in a source-drain breakdown test, in the unit of V, and the y axis represents the logarithmic value of the measured source-drain breakdown current density in a source-drain breakdown test, in the unit of A/µm. Curve 91 illustrates the source-drain breakdown characteristic curve of a conventional LDMOS transistor; curve 92 illustrates the source-drain breakdown characteristic curve of an LDMOS transistor having 250 Å of the insulation structure 120 removed; and curve 93 illustrates the source-drain breakdown characteristic curve of an LDMOS transistor having 500 Å of the insulation structure 120 removed.

As shown in FIG. 9, the source-drain BV of the disclosed LDMOS transistor may be higher than the source-drain BV of the conventional LDMOS transistor. The three transistors shown in FIG. 9, the BV of the LDMOS transistor having 500 Å of the insulation structure 120 removed may be about 15 V; the BV of the LDMOS transistor having 250 Å of the insulation structure 120 removed may be about 14.5 V; and the BV of the conventional LDMOS may be about 14.3 V. Thus, the source-drain breakdown characteristic of an LDMOS transistor may be improved using the disclosed technical solution.

In one embodiment, forming the first doped region 101 after the formation of the insulation structure 120 is only exemplary. In other various embodiments of the present disclosure, the first doped region may also be formed before the formation of the insulation structure 120.

For example, after providing the substrate and before forming the mask layer, the process to form the semiconductor device may include forming the first doped region in the substrate. The first doped region may be doped with first dopant ions. In the step to form the mask layer, a portion of the first doped region may be exposed by the bottom of the opening in the mask layer. To form an insulation structure, the insulation structure may be formed in the first doped region. Specifically, a thermal oxidization may be performed on the portion of the first doped region exposed by the bottom of the opening, to form the insulation structure in the first doped region.

Accordingly, the present disclosure may further include a semiconductor device. The semiconductor device may include a substrate, an insulation structure in the substrate, and a gate electrode over the substrate. The top of the insulation structure may include a recess region. The gate electrode may cover a portion of the recess region.

As shown in FIG. 7, a cross-sectional view of disclosed semiconductor device is illustrated. In one embodiment, the disclosed semiconductor device may be used to form an LDMOS transistor. In other various embodiments, the disclosed semiconductor device may also be used to form other semiconductor devices.

The semiconductor device may include a substrate 100, an insulation structure 120 in the substrate 100, and a gate electrode over the substrate 100. The top of the insulation structure 120 may include a recess region, and the gate electrode may cover a portion of the recess region.

As shown in FIG. 7, the substrate 100 may provide a platform for fabrication. In one embodiment, the substrate 100 may be made of single crystal silicon. In other embodiments of the present disclosure, the substrate 100 may also be made of poly-silicon and/or amorphous-silicon. The substrate 100 may also be made of one or more of silicon, germanium, gallium arsenide, and/or silicon germanium compounds. The substrate 100 may also be made of other suitable semiconductor materials. The substrate 100 may also be made of a silicon structure having an epitaxial layer and/or an epitaxial silicon structure.

In one embodiment, the disclosed semiconductor device may be used to form an LDMOS transistor. Accordingly, the semiconductor device may also include a first doped region 101 in the substrate 100, and the first doped region may be doped with first dopant ions.

The first doped region 101 may be the drift region of the LDMOS transistor, to extend the current path of the LDMOS transistor and increase the BV of the LDMOS transistor.

The first doped region 101 may be doped with first dopant ions. The first dopant ions may include N type ions or P type ions. The specific type of dopant ions may be determined based on the type of the LDMOS transistor to be formed. In one embodiment, the LDMOS transistor to be formed may be an N type transistor, and the first dopant ions may be N type, including one or more of phosphorous ions, arsenic ions, and antimony ions.

The semiconductor device may also include a second doped region 102 in the substrate 100, separated from the first doped region 101 by a certain distance. The second doped region 102 may be doped with second dopant ions.

The second doped region 102 may be the body region of the LDMOS transistor formed from the disclosed semiconductor device, to form a channel region having a doping concentration that varies in gradient. The conductivity type of the second dopant ions may be the opposite of the conductivity type of the first dopant ions. Specifically, in one embodiment, the second dopant ions may be P type ions, including one or more of boron ions, indium ions, and gallium ions.

The semiconductor device may further include an insulation structure 120 in the substrate 100, and a gate electrode over the substrate 100. The top of the insulation structure 120 may include a recess region, and the gate electrode may cover a portion of the recess region.

The insulation structure 120 may separate the channel region of the LDMOS transistor and the drain region of the LDMOS region, to facilitate the extension of current path and increase the BV of the LDMOS transistor. The insulation structure 120 may be made of a suitable oxide.

The substrate 100 may include a first doped region 101. Accordingly, the insulation structure 120 may be in the first doped region 101 of the substrate 100. That is, the first doped region 101 in the substrate 100 may surround the insulation structure 120.

The semiconductor device may also include an oxidation layer (now shown in the figures) over the substrate. The insulation structure 120 may be formed through a LOCOS process. Thus, during the formation of the insulation structure 120, some oxygen atoms may diffuse into the substrate 100 along a direction perpendicular to the substrate 100, and some oxygen atoms may diffuse laterally along the oxidation layer 103 in a plane parallel to the surface of the substrate 100. Thus, along the direction from a sidewall of the opening 111 to a neighboring portion of the mask layer 110, the thickness of the insulation structure 120 may gradually decrease.

The insulation structure 120 may separate the channel region of the LDMOS transistor and the drain region of the LDMOS transistor, and may extend the current path. If, in the plane parallel to the surface of the substrate, the dimensions of the insulation structure are too small, the distance between the channel region of the LDMOS and the drain region may be too small, making it difficult to increase the BV of the LDMOS transistor. Thus, in the plane parallel to the surface of the substrate 100, the dimensions of the insulation structure may not be too small. During the formation of the insulation structure, it is desired to facilitate lateral diffusion of oxygen atoms in the plane parallel to the surface of the substrate 100, to increase the lateral dimension of the insulation structure.

An oxidation layer 103 may be formed over the substrate 100. During the formation of the insulation structure 120, some oxygen atoms may diffuse into the substrate 100 along a direction perpendicular to the substrate 100, and some oxygen atoms may diffuse laterally along the oxidation layer 103 in a plane parallel to the surface of the substrate 100. Thus, along the direction from a sidewall of the opening 111 to a neighboring portion of the mask layer 110, the thickness of the insulation structure 120 may gradually decrease. That is, the insulation structure 120 may have a bird's beak structure.

During the formation of the insulation structure 120, at the same time the oxygen atoms are diffusing laterally, the oxygen atoms are also diffusing along the direction perpendicular to the surface of the substrate 100. Thus, when the dimensions of the insulation structure 120 in the plane parallel to the surface of the substrate 100 satisfy the design requirement, the thickness of the insulation structure 120 may be considerably large.

The recess region on the top of the insulation structure 120 may reduce the thickness of the insulation structure 120, and the distance between the gate electrode, over the insulation structure 120, and the substrate 100, can be decreased. This allows an easy increase of the thickness of the depletion region under the insulation structure and the control ability of the gate electrode. Thus, current density can be improved, the thickness of the depletion region under the insulation structure can be increased, and the BV of the semiconductor device can be improved.

If the recess region 130 is too deep, and the thickness of the remaining portion of the insulation structure 120 may be too small, making it susceptible to gate electrode breakdown. Thus, in one embodiment, a ratio of the depth of the recess region 130 to the thickness of the remaining portion of the insulation structure 120 may be less than 1.

The gate electrode 140 may cover a portion of the recess region. The arrangement of the recess region may reduce the distance between the gate electrode 140 and the first doped region 101 and improve the control ability of the gate electrode 140. When the LDMOS transistor, formed from the disclosed semiconductor device, is turned on, the gate electrode 140 may have improved control power and may effectively increase the thickness of the depletion region in the first doped region 101, and the BV of the LDMOS transistor may be increased.

In one embodiment, the disclosed semiconductor device may be used to form an LDMOS transistor, and the substrate 100 may include a second doped region 102 for forming a body region. Thus, the gate electrode 140 may be over the second doped region 102 to facilitate the control over the second doped region 102.

Referring to FIG. 7, the semiconductor device may further include a drain region 151 and a source region 152. The drain region 151 may be formed in the first doped region 101 on the side of the insulation structure 120 facing away from the gate electrode 140. The drain region 151 may be doped with first dopant ions. The source region 152 may be formed in the portion of the second doped region 102 exposed by the gate electrode 140. The source region 152 may be doped with first dopant ions.

Thus, the disclosed semiconductor device may further include a lightly-doped region 153, a source-connecting plugging structure 162, a drain-connecting plugging structure 161, and a lightly-doped-connecting plugging structure 163. The lightly-doped region 153 may be formed in the second doped region 102 on the side of the source region 152 facing away from the gate electrode 140. The lightly-doped region 153 may be doped with second dopant ions. Further, the source-connecting plugging structure 162 may be formed on the source region 153, the drain-connecting plugging structure 161 may be formed on the drain region 151, and the lightly-doped-connecting plugging structure 163 may be formed on the lightly-doped region 153.

In the present disclosure, by forming a recess region on the top of the insulation structure, the thickness of the insulation structure is reduced. Accordingly, the distance between the gate electrode, over the insulation structure, and the substrate, may be reduced. Thus, the gate electrode may have improved control over the channel region in the substrate, and the thickness/depth of the depletion region in the channel region may be expanded/increased. The increase of the depth of the depletion region may reduce the on-resistance of the formed semiconductor device, and improve the BV of the semiconductor device. Further, in the embodiments of the present disclosure, the formed semiconductor device may be used to form an LDMOS transistor. Thus, after the recess region is formed, an ion implantation may be performed in the portions of the substrate under and neighboring the insulation structure to form the first doped region that surrounds the insulation structure. The arrangement of the recess region may increase the dose of doped ions to increase the doping concentration of the first doped region. Accordingly, the on-resistance of the LDMOS transistor, containing the semiconductor device, may be reduced.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A method for forming a semiconductor device, comprising:
    forming a mask layer over a substrate, the mask layer containing an opening, exposing a surface portion of the substrate to form an exposed surface portion of the substrate;
    forming an insulation structure between the mask layer and the substrate, and in the opening;
    performing a thinning process on the insulation structure exposed by the opening to form a recess region on a top of the insulation structure; and
    forming a gate electrode over the insulation structure and covering a portion of the recess region.

2. The method according to claim 1, wherein the insulation structure is formed at a bottom of the opening and under portions of the mask layer neighboring the opening, a thickness of the insulation structure gradually decreasing along a direction from a sidewall of the opening to a portion of the mask layer neighboring the sidewall of the opening.

3. The method according to claim 1, wherein the insulation structure is made of an oxide.

4. The method according to claim 3, further including:
    forming an oxidation layer over the substrate, before forming a mask layer, wherein:
    the oxidation layer is formed to expose the surface portion of the substrate; and
    the insulation structure is formed through a localized oxidation of silicon on the exposed surface portion of the substrate.

5. The method according to claim 1, wherein performing a thinning process on the insulation structure includes:
    using the mask layer as an etch mask to remove a portion of a total thickness of the insulation structure in the opening and to form the recess region at the top of the insulation structure.

6. The method according to claim 5, wherein a dry etching process is used to remove the portion of the total thickness of the insulation structure.

7. The method according to claim 1, wherein a ratio of a depth of the recess region to a thickness of a remaining portion of the insulation structure at the bottom of the opening is smaller than 1.

8. The method according to claim 1, after forming the recess region and before forming the gate electrode, further comprising forming a first doped region in the substrate to surround the insulation structure, the first doped region being doped with first dopant ions, wherein the semiconductor device is a lateral diffused metal oxide semiconductor transistor.

9. The method according to claim 8, wherein the first doped region is formed in the substrate through an ion implantation process.

10. The method according to claim 9, wherein the ion implantation process is performed on portions of the substrate under and neighboring the insulation structure.

11. The method according to claim 8, further comprising: forming a second doped region in the substrate separated from the first doped region, the second doped region being doped with second dopant ions, wherein the gate electrode is located over the second doped region.

12. The method according to claim 11, after forming the gate electrode, further comprising:
    forming a drain region in the first doped region on a side of the insulation structure facing away from the gate electrode, the drain region being doped with first dopant ions; and
    forming a source region in a portion of the second doped region exposed by the gate electrode, the source region being doped with first dopant ions.

13. The method according to claim 1, further comprising: before forming the mask layer, a first doped region is formed in the substrate to surround the insulation structure, the first doped region being doped with first dopant ions, wherein:
    the semiconductor device is a lateral diffused metal oxide semiconductor transistor;
    the bottom of the opening exposes the first doped region; and
    the insulation structure is formed over the first doped region.

14. A semiconductor device, comprising:
a substrate;
an insulation structure on the substrate, a top of the insulation structure having a recess region; and
a gate electrode, over the insulation structure, covering a portion of the recess region, and exposing a remaining portion of the recess region, wherein the recess region is located at a center and the top of the insulation structure.

15. The semiconductor device according to claim 14, wherein: a thickness of the insulation structure gradually decreases along a direction pointing from a sidewall of the recess region to a portion of the substrate neighboring the recess region.

16. The semiconductor device according to claim 15, wherein the insulation structure is formed through a localized oxidation of silicon.

17. The semiconductor device according to claim 14, wherein a ratio of a depth of the recess region to a thickness of the insulation layer at the bottom of the recess region is smaller than 1.

18. The semiconductor device according to claim 14, further comprising a first doped region in the substrate and surrounding the insulation structure, the first doped region being doped with first dopant ions.

19. The semiconductor device according to claim 18, further comprising a second doped region in the substrate separated from the first doped region, the second doped region being doped with second dopant ions, wherein the gate electrode is located over a portion of the second doped region.

20. The semiconductor device according to claim 19, further comprising:
a drain region in the first doped region on a side of the insulation structure facing away from the gate electrode, the drain region being doped with first dopant ions; and
a source region in a portion of the second doped region exposed by the gate electrode, the source region being doped with first dopant ions.

* * * * *